(12) United States Patent
Kondo

(10) Patent No.: US 7,875,148 B2
(45) Date of Patent: Jan. 25, 2011

(54) ADHESIVE TAPE ATTACHING METHOD

(75) Inventor: Azumi Kondo, Ota-ku (JP)

(73) Assignee: Disco Corporation, Tokyo (JP)

( * ) Notice: Subject to any disclaimer, the term of this patent is extended or adjusted under 35 U.S.C. 154(b) by 94 days.

(21) Appl. No.: 12/490,848

(22) Filed: Jun. 24, 2009

(65) Prior Publication Data

US 2010/0000654 A1    Jan. 7, 2010

(30) Foreign Application Priority Data

Jul. 3, 2008     (JP) .............................. 2008-174187

(51) Int. Cl.
*B32B 37/12*    (2006.01)
(52) U.S. Cl. ........................ 156/285; 156/247; 156/293; 156/344
(58) Field of Classification Search ........................ None
See application file for complete search history.

(56) References Cited

U.S. PATENT DOCUMENTS

2003/0173017 A1* 9/2003 Hecht et al. .................. 156/154
2007/0045799 A1* 3/2007 Sekiya ........................ 257/678
2007/0218648 A1* 9/2007 Ishizuka et al. ............. 438/458

FOREIGN PATENT DOCUMENTS

| JP | 6-177243 | 6/1994 |
| JP | 2005-135931 | 5/2005 |
| JP | 2007-19461 | 1/2007 |

* cited by examiner

*Primary Examiner*—Sam C Yao
(74) *Attorney, Agent, or Firm*—Greer, Burns & Crain, Ltd.

(57) ABSTRACT

An adhesive tape attaching method for attaching an adhesive tape to the back side of a wafer, the wafer having a device area where a plurality of devices are formed on the front side of the wafer and a peripheral marginal area surrounding the device area, wherein the back side of the wafer is formed with a circular recess corresponding to the device area and an annular reinforcing portion surrounding the circular recess so as to correspond to the peripheral marginal area. The adhesive tape attaching method includes the steps of holding the wafer and the adhesive tape in a low-pressure condition so that the back side of the wafer is opposed to the adhesive surface of the adhesive tape, fixedly providing a plate member in the condition where the plate member is opposed to the nonadhesive surface of the adhesive tape, pressing the back side of the wafer against the adhesive surface of the adhesive tape, and engaging the plate member into the circular recess formed on the back side of the wafer in the condition where the adhesive tape is closely fitted in the circular recess.

3 Claims, 7 Drawing Sheets

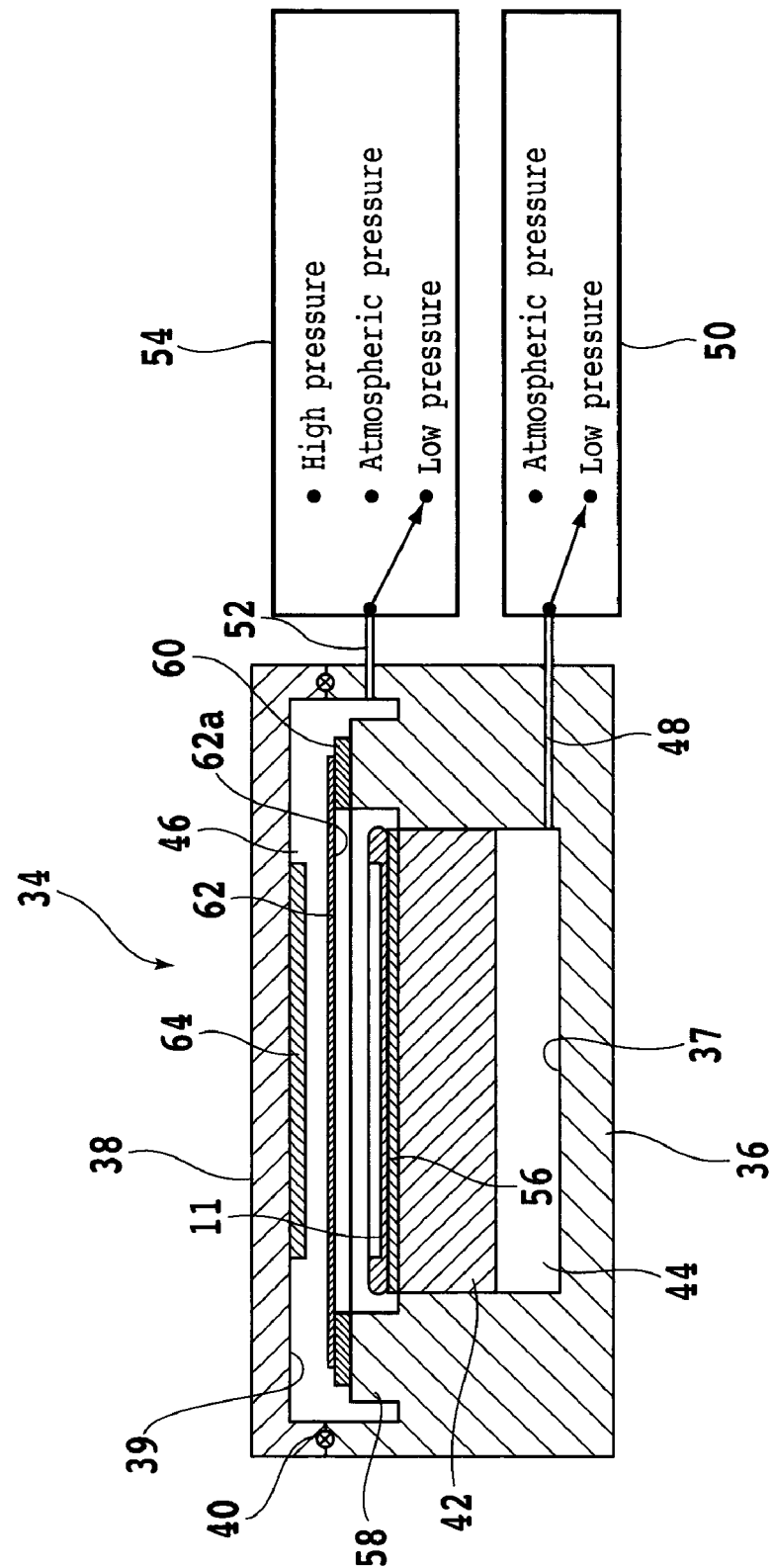

ADHESIVE TAPE ATTACHING METHOD

BACKGROUND OF THE INVENTION

1. Field of the Invention

The present invention relates to an adhesive tape attaching method for attaching an adhesive tape to the back side of a wafer having a circular recess on the back side.

2. Description of the Related Art

In a semiconductor device fabrication process, a plurality of crossing division lines called streets are formed on the front side of a substantially disk-shaped semiconductor wafer to thereby partition a plurality of regions where devices such as ICs and LSIs are respectively formed. The semiconductor wafer is cut along these streets by a cutting apparatus to thereby divide the semiconductor wafer into individual semiconductor chips (devices). Prior to cutting the wafer along the streets, the back side of the wafer is ground or polished to reduce the thickness of the wafer to a predetermined value. In recent years, it has been required to further reduce the wafer thickness to about 50 µm, for example, in order to achieve a reduction in size and weight of electric equipment.

However, such a thin wafer is difficult to handling and there is a possibility of damage to the wafer during transportation thereof. To solve this problem, there has been proposed a grinding method in Japanese Patent Laid-open No. 2007-19461, for example. In this grinding method, the back side of a wafer is ground in only an area corresponding to a device area where the devices are formed on the front side of the wafer, thereby forming a circular recess corresponding to the device area and an annular reinforcing portion surrounding the circular recess so as to correspond to a peripheral marginal area surrounding the device area. On the other hand, to ease the handling of the individual devices obtained by cutting the semiconductor wafer, the semiconductor wafer is attached to a dicing tape (adhesive tape) prior to cutting the wafer. That is, in cutting the wafer by using a cutting apparatus, the wafer with the adhesive tape is cut by a cutting blade from the front side of the wafer to the middle of the thickness of the adhesive tape, thereby dividing the wafer into the individual devices in the condition where the individual devices are attached to the adhesive tape. Accordingly, scattering of the individual devices can be prevented even after cutting the wafer.

A method of attaching an adhesive tape to a semiconductor wafer is known in the art (see Japanese Patent Laid-open No. Hei 6-177243, for example). In this method, the adhesive tape is attached to the back side of the semiconductor wafer by opposing the adhesive surface of the adhesive tape to the back side of the semiconductor wafer and sliding a roller on the nonadhesive surface of the adhesive tape. However, there is a possibility of damage to the thin semiconductor wafer by the pressure of the roller. To cope with this problem, there has been proposed a device for attaching a semiconductor wafer to an adhesive tape by the expansion of an elastic member for supporting the semiconductor wafer (see Japanese Patent Laid-open No. 2005-135931, for example).

However, there arises a problem even when such a device is used to attach the adhesive tape to the semiconductor wafer. That is, in a semiconductor wafer having a circular recess formed by grinding the back side of the wafer in only an area corresponding to the device area to thereby form an annular reinforcing portion around the circular recess so as to correspond to the peripheral marginal area surrounding the device area, there is a possibility of damage due to the stress generated at the boundary between the annular reinforcing portion and the circular recess in attaching the adhesive tape.

SUMMARY OF THE INVENTION

It is therefore an object of the present invention to provide an adhesive tape attaching method which can attach a semiconductor wafer to an adhesive tape without damage to the wafer, wherein a circular recess is formed on the back side of the wafer by grinding only an area corresponding to the device area, and an annular reinforcing portion is formed around the circular recess in an area corresponding the peripheral marginal area surrounding the device area.

In accordance with an aspect of the present invention, there is provided an adhesive tape attaching method for attaching an adhesive tape to the back side of a wafer, the wafer having a device area where a plurality of devices are formed on the front side of the wafer and a peripheral marginal area surrounding the device area, wherein the back side of the wafer is formed with a circular recess corresponding to the device area and an annular reinforcing portion surrounding the circular recess so as to correspond to the peripheral marginal area, the adhesive tape attaching method including the steps of holding the wafer and the adhesive tape in a low-pressure condition so that the back side of the wafer is opposed to the adhesive surface of the adhesive tape; fixedly providing a plate member in the condition where the plate member is opposed to the nonadhesive surface of the adhesive tape; pressing the back side of the wafer against the adhesive surface of the adhesive tape; and engaging the plate member into the circular recess formed on the back side of the wafer in the condition where the adhesive tape is closely fitted in the circular recess.

Preferably, the adhesive tape attaching method further includes the steps of supporting the front side of the wafer on an elastic member in the condition where the back side of the wafer is opposed to the adhesive surface of the adhesive tape; and providing an atmospheric-pressure condition in a sealed space formed on the side opposite to a wafer supporting surface of the elastic member, thereby bringing the back side of the wafer into pressure contact with the adhesive surface of the adhesive tape.

In accordance with another aspect of the present invention, there is provided an adhesive tape attaching method for attaching an adhesive tape to the back side of a wafer, the wafer having a device area where a plurality of devices are formed on the front side of the wafer and a peripheral marginal area surrounding the device area, wherein the back side of the wafer is formed with a circular recess corresponding to the device area and an annular reinforcing portion surrounding the circular recess so as to correspond to the peripheral marginal area, the adhesive tape attaching method including the steps of separating a sealed space into a first sealed space and a second sealed space by a piston inserted in the sealed space; fixedly holding the adhesive tape in the second sealed space in the condition where the adhesive surface of the adhesive tape is opposed to the piston; supporting the wafer to the piston in the second sealed space in the condition where the circular recess formed on the back side of the wafer is opposed to the adhesive surface of the adhesive tape; fixedly providing a plate member in the condition where the plate member is opposed to the nonadhesive surface of the adhesive tape, the plate member being adapted to engage with the circular recess of the wafer; and providing a low-pressure condition in the second sealed space and an atmospheric-pressure condition in the first sealed space to thereby drive the piston and engage the plate member into the circular recess of the wafer through the adhesive tape, so that the back side of the wafer comes into pressure contact with the adhesive surface of the adhesive tape.

According to the present invention, the plate member is engaged into the circular recess formed on the back side of the wafer by grinding only an area corresponding to the device area formed on the front side of the wafer, thereby attaching the adhesive tape to the back side of the wafer. Accordingly, the wafer can be attached to the adhesive tape without damage to the wafer.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 7 is a vertical sectional view of an adhesive tape attaching apparatus suitable for use in performing the adhesive tape attaching method according to the present invention.

DETAILED DESCRIPTION OF THE PREFERRED EMBODIMENTS

Figure 1:
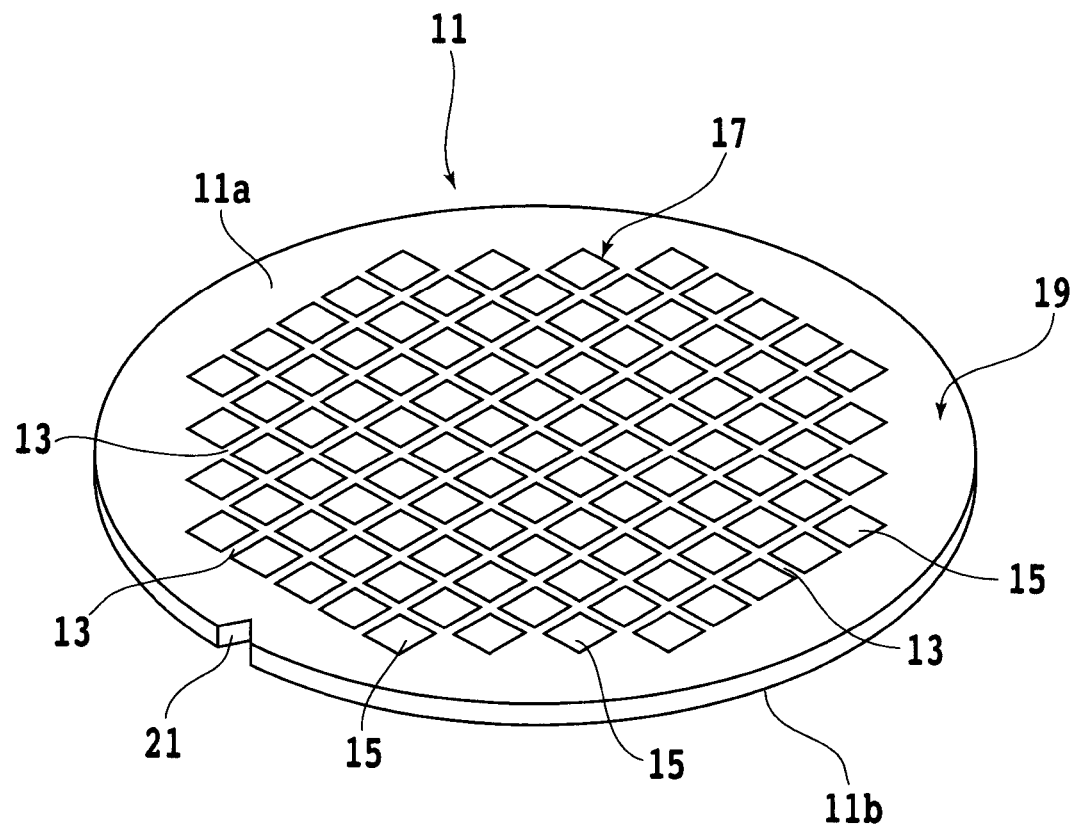
FIG. 1 is a perspective view of a semiconductor wafer as viewed from the front side thereof.

A preferred embodiment of the present invention will now be described in detail with reference to the drawings. FIG. 1 is a perspective view of a semiconductor wafer 11 before it is processed to have a predetermined thickness. The semiconductor wafer 11 shown in FIG. 1 is a silicon wafer having a thickness of 700 μm, for example. The semiconductor wafer 11 has a front side 11a and a back side 11b. A plurality of crossing streets 13 are formed on the front side 11a of the semiconductor wafer 11 to thereby partition a plurality of rectangular regions where a plurality of devices 15 such as ICs and LSIs are respectively formed.

Figure 2:
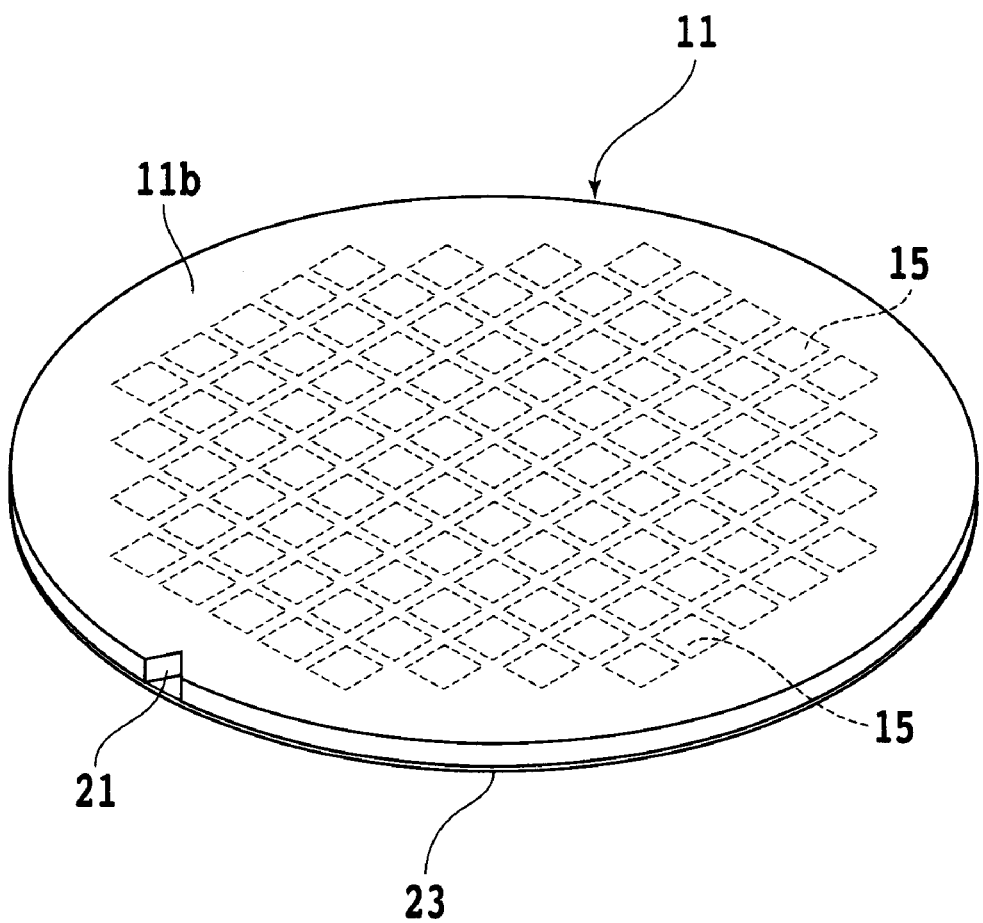
FIG. 2 is a perspective view of the semiconductor wafer as viewed from the back side thereof in the condition where a protective tape is attached to the front side of the semiconductor wafer.

The semiconductor wafer 11 includes a device area 17 where the devices 15 are formed and a peripheral marginal area 19 surrounding the device area 17. Further, a notch 21 as a mark for indicating the crystal orientation of the silicon wafer is formed on the outer circumference of the semiconductor wafer 11. As shown in FIG. 2, a protective tape 23 is attached to the front side 11a of the semiconductor wafer 11 by a protective tape attaching step. Accordingly, the front side 11a of the semiconductor wafer 11 is protected by the protective tape 23, and the back side 11b of the semiconductor wafer 11 is exposed as shown in FIG. 2.

Figure 3:
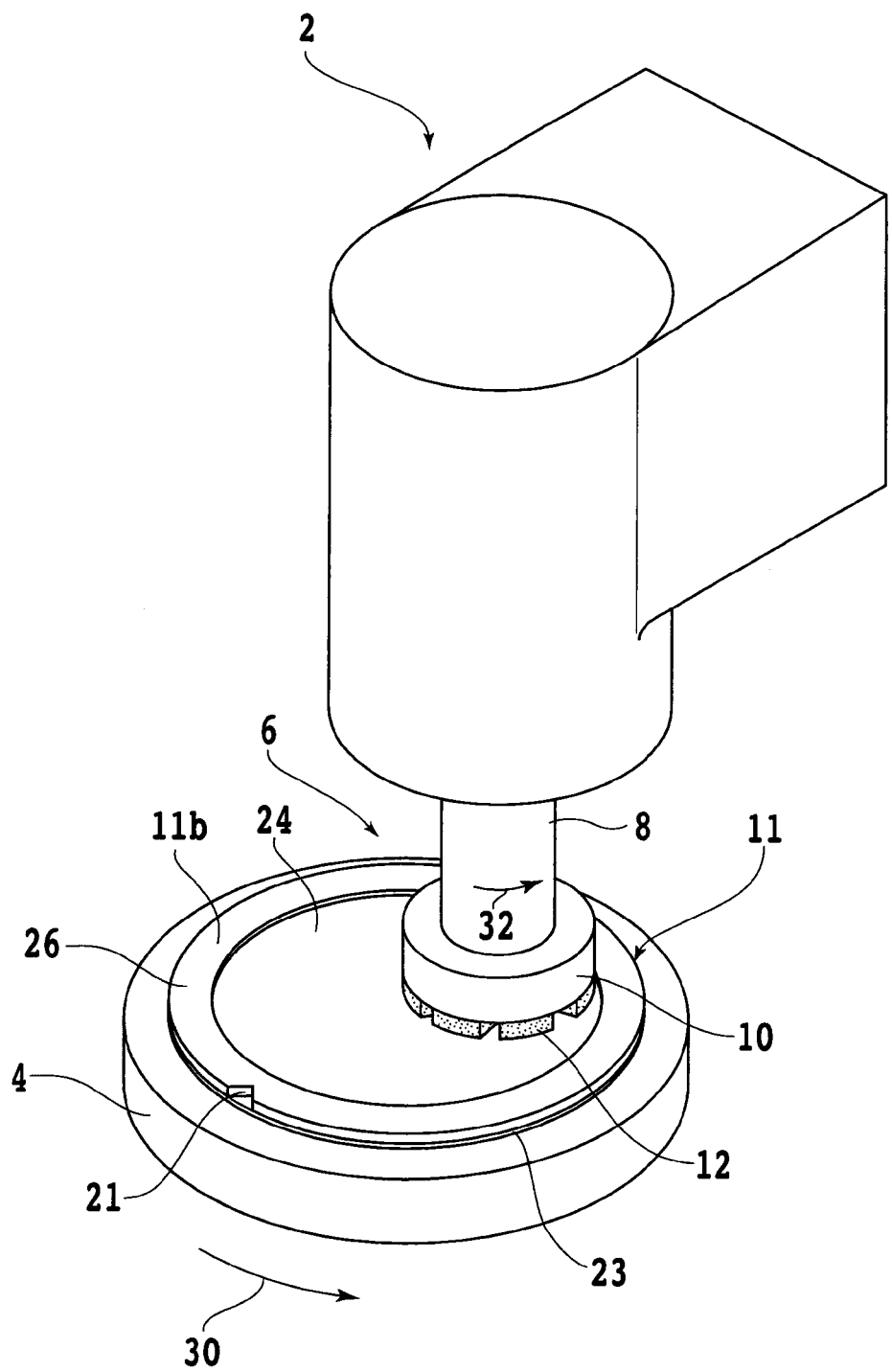
FIG. 3 is a perspective view showing an essential part of a grinding apparatus.
Figure 4:
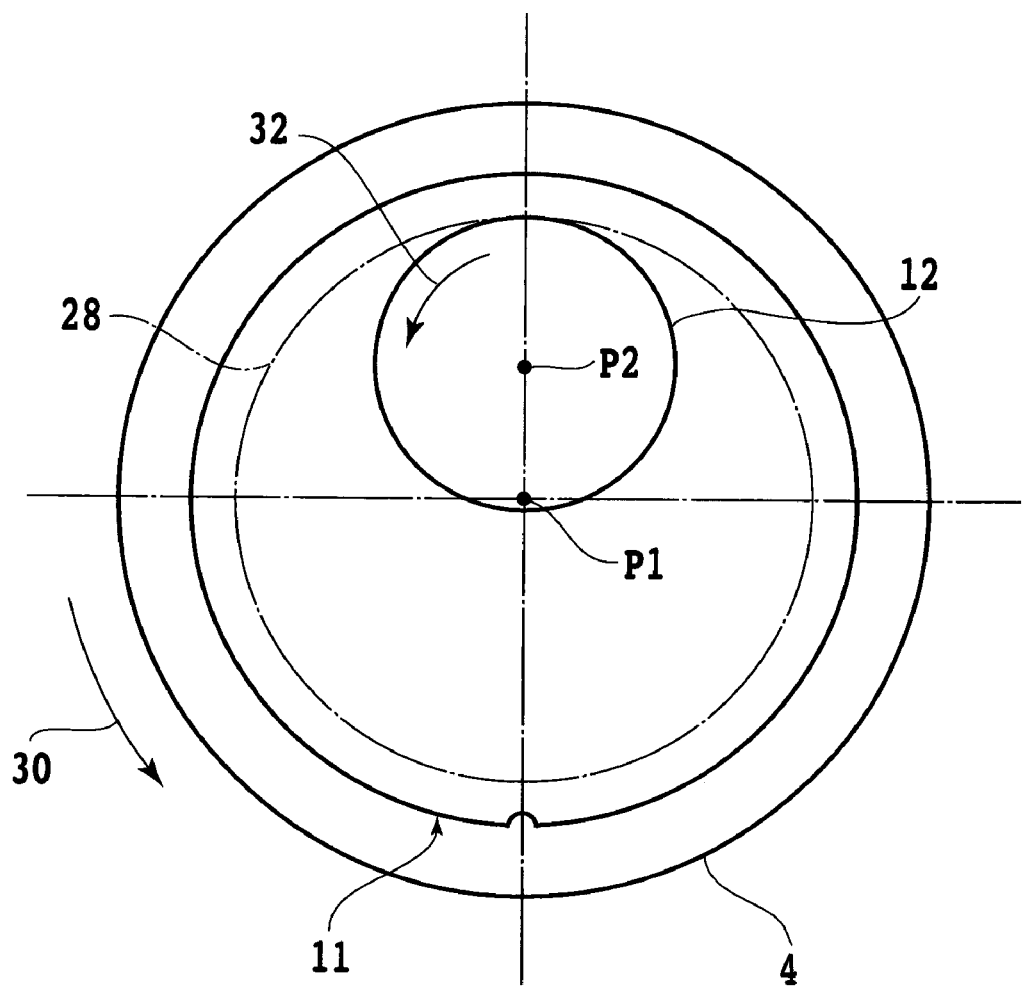
FIG. 4 is a schematic plan view for illustrating a circular recess forming step to be performed by the grinding apparatus.
Figure 5:
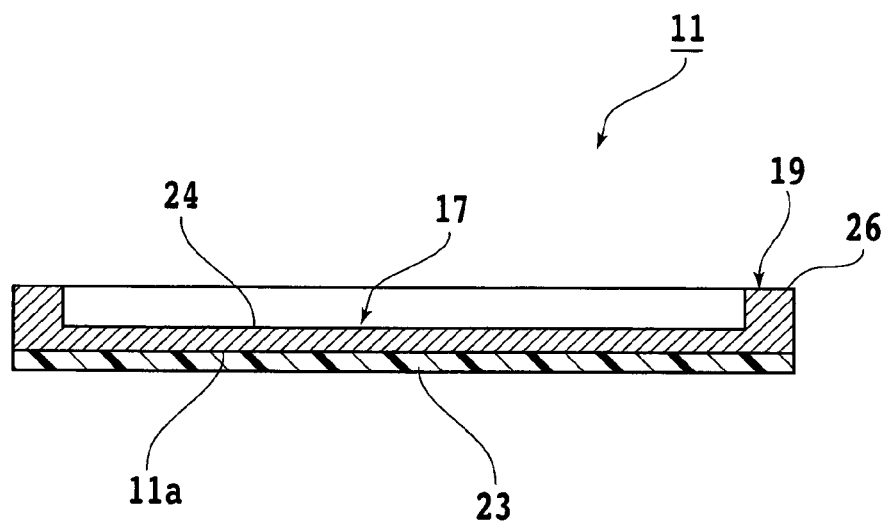
FIG. 5 is a sectional view of the semiconductor wafer processed by the circular recess forming step.

Referring now to FIGS. 3 to 5, there is shown a grinding method for grinding the back side 11b of the semiconductor wafer 11 to thereby form a circular recess corresponding to the device area 17 and an annular reinforcing portion around the circular recess as including the peripheral marginal area 19. Referring first to FIG. 3, there is shown a perspective view of an essential part of a grinding apparatus 2. The grinding apparatus 2 includes a rotatable chuck table 4 for holding the semiconductor wafer 11 and a grinding unit 6 for grinding the semiconductor wafer 11 held on the chuck table 4. The grinding unit 6 includes a spindle 8 rotatable and vertically movable, a grinding wheel 10 mounted on the lower end of the spindle 8, and an abrasive ring 12 fixed to the lower surface of the grinding wheel 10.

The semiconductor wafer 11 is held on the chuck table 4 in the condition where the protective tape 23 attached to the front side 11a of the semiconductor wafer 11 is placed on the chuck table 4 and the back side 11b of the semiconductor wafer 11 is opposed to the abrasive ring 12. The relation between the semiconductor wafer 11 held on the chuck table 4 and the abrasive ring 12 mounted on the grinding wheel 10 will now be described with reference to FIG. 4. The center P1 of rotation of the chuck table 4 and the center P2 of rotation of the abrasive ring 12 are deviated from each other as shown in FIG. 4. Further, the outer diameter of the abrasive ring 12 is set smaller than the diameter of a boundary circle 28 between the device area 17 and the peripheral marginal area 19 of the semiconductor wafer 11 and slightly larger than the radius of this boundary circle 28. Accordingly, the abrasive ring 12 passes through the center P1 of rotation of the chuck table 4.

The chuck table 4 is rotated at 300 rpm, for example, in the direction shown by an arrow 30, and the abrasive ring 12 (i.e., the grinding wheel 10) is rotated at 6000 rpm, for example, in the direction shown by an arrow 32. At the same time, a feed mechanism (not shown) is operated to bring the abrasive ring 12 fixed to the grinding wheel 10 into contact with the back side 11b of the semiconductor wafer 11 and to downward feed the grinding wheel 10 by a predetermined amount at a predetermined feed rate. As a result, the back side 11b of the semiconductor wafer 11 is ground in only the device area 17 to form a circular recess 24 having a predetermined depth as shown in FIG. 5. That is, the thickness of the semiconductor wafer 11 in only the device area 17 is reduced to a predetermined thickness (e.g., 50 μm). At the same time, an annular reinforcing portion 26 is formed in the peripheral marginal area 19 so as to surround the circular recess 24 as shown in FIG. 5.

Figure 6:
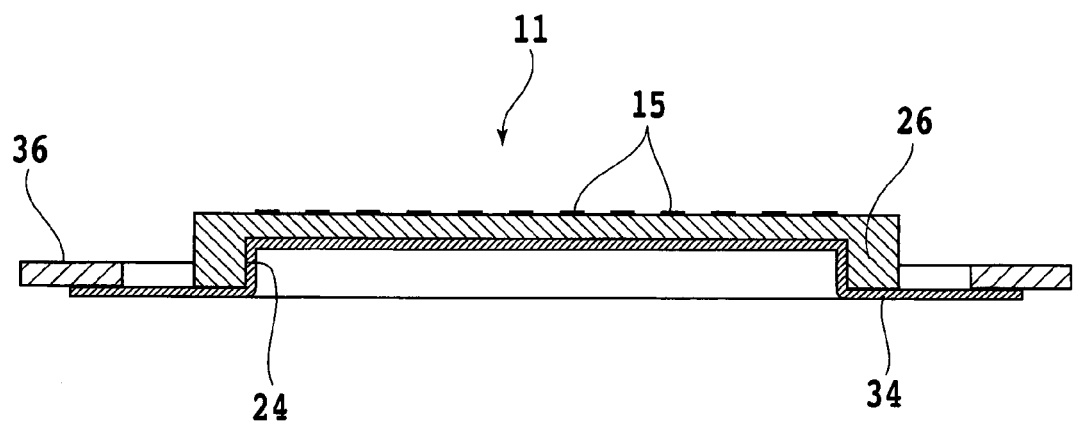
FIG. 6 is a sectional view of the semiconductor wafer in the condition where it is supported through a dicing tape to an annular frame.

The semiconductor wafer 11 thus ground is cut along each street 13 by a cutting apparatus (dicing apparatus) to obtain the individual divided semiconductor chips (devices) 15. Prior to such a wafer cutting step, the semiconductor wafer 11 is attached to a dicing tape (adhesive tape) 62 supported at its outer circumferential portion to an annular frame 60 as shown in FIG. 6. An adhesive tape attaching method according to the present invention will now be described with reference to FIGS. 7 to 8B.

Referring to FIG. 7, there is shown a vertical sectional view of an adhesive tape attaching apparatus 34 suitable for use in performing the adhesive tape attaching method according to the present invention. The adhesive tape attaching apparatus 34 includes a base 36 having a recess 37 and a top cover 38 having a recess 39. The base 36 and the top cover 38 are joined together in the condition where the recess 37 and the recess 39 are opposed to each other and an annular sealing member 40 is interposed between the joining surfaces of the base 36 and the top cover 38 to thereby define a sealed space between the base 36 and the top cover 38. A piston 42 is inserted in this sealed space, so that this sealed space is separated into a first sealed space 44 and a second sealed space 46 by the piston 42.

The first sealed space 44 is connected through a first communication passage 48 to a first electromagnetic valve 50. The first electromagnetic valve 50 can selectively provide a low-pressure condition and an atmospheric-pressure condition in the first sealed space 44.

The second sealed space 46 is connected through a second communication passage 52 to a second electromagnetic valve 54. The second electromagnetic valve 54 can selectively provide a low-pressure condition, an atmospheric-pressure condition, and a high-pressure condition in the second sealed space 46. An elastic plate 56 such as a rubber plate is mounted on the piston 42, and the semiconductor wafer 11 is placed on the elastic plate 56 in the condition where the back side 11b of the semiconductor wafer 11 is oriented upward. The base 36 is formed with an annular projection 58, and the annular frame 60 supporting the outer circumferential portion of the dicing tape (adhesive tape) 62 is mounted on the annular projection 58 of the base 36 in the condition where the adhesive surface of the dicing tape 62 is oriented downward. Further, a circular plate 64 having a size substantially equal to the size of the circular recess 24 of the semiconductor wafer 11 is fixed to the inside surface of the top cover 38.

The operation of the adhesive tape attaching apparatus 34 will now be described with reference to FIGS. 8A and 8B. First, the top cover 38 is removed from the base 36 to set the semiconductor wafer 11 and the dicing tape 62 supported to the annular frame 60 in the respective predetermined positions as shown in FIG. 7. Thereafter, the top cover 38 is closed to the base 36 to ensure the sealed space by the annular sealing member 40. In this condition, both the first sealed space 44 and the second sealed space 46 are evacuated.

Figure 8A:
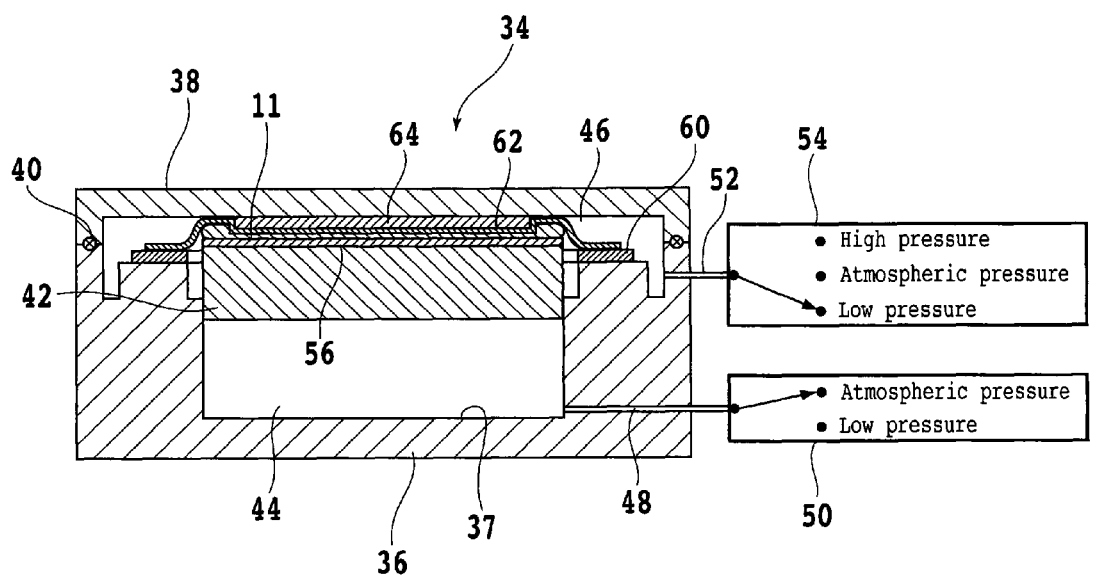
FIGS. 8A and 8B are vertical sectional views for illustrating the operation of the adhesive tape attaching apparatus shown in FIG. 7.

Thereafter, only the first electromagnetic valve 50 is switched to provide the atmospheric-pressure condition of the first sealed space 42 with the second sealed space 46 being kept in the low-pressure condition as shown in FIG. 8A. As a result, the piston 42 is raised by a pressure difference between the first sealed space 44 and the second sealed space 46, thereby pressing the inside surface of the circular recess 24 of the semiconductor wafer 11 against the circular plate 64 through the dicing tape 62. Since the size of the circular plate 64 substantially corresponds to the size of the circular recess 24 of the semiconductor wafer 11, the dicing tape 62 can be attached to the whole of the back side 11b of the semiconductor wafer 11 in such a manner that the dicing tape 62 comes into close contact with the inside surface of the circular recess 24 of the semiconductor wafer 11.

Figure 8B:
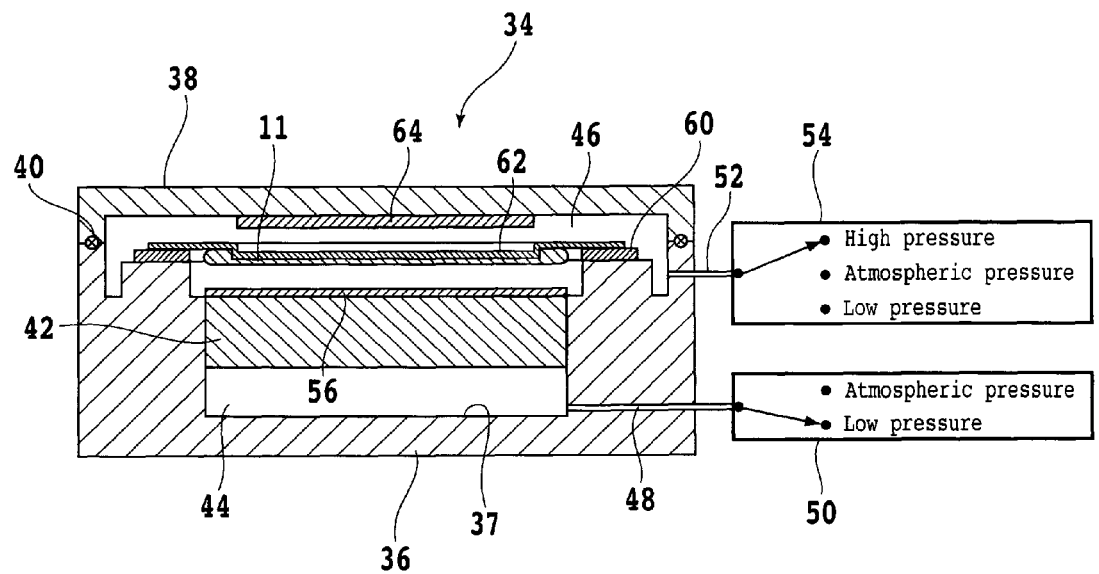

Thereafter, the first and second electromagnetic valves 50 and 54 are switched to provide the low-pressure condition in the first sealed space 44 and the high-pressure condition in the second sealed condition in the second sealed space 46 as shown in FIG. 8B. As a result, the piston 42 is lowered by a pressure difference between the first sealed space 44 and the second sealed space 46. In this condition or in the condition where the first and second electromagnetic valves 50 and 54 are switched to provide the atmospheric-pressure conditions in the first and second sealed spaces 44 and 46, the top cover 38 is removed to obtain the semiconductor wafer 11 supported to the annular frame 60 in the condition where the back side 11b of the semiconductor wafer 11 is attached to the dicing tape 62.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An adhesive tape attaching method for attaching an adhesive tape to the back side of a wafer, said wafer having a device area where a plurality of devices are formed on the front side of said wafer and a peripheral marginal area surrounding said device area, wherein the back side of said wafer is formed with a circular recess corresponding to said device area and an annular reinforcing portion surrounding said circular recess so as to correspond to said peripheral marginal area, said adhesive tape attaching method comprising the steps of:

holding said wafer and said adhesive tape in a low-pressure condition so that the back side of said wafer is opposed to an adhesive surface of said adhesive tape;

fixedly providing a plate member in the condition where said plate member is opposed to a nonadhesive surface of said adhesive tape;

pressing the back side of said wafer against the adhesive surface of said adhesive tape;

engaging said plate member into said circular recess formed on the back side of said wafer in the condition where said adhesive tape is closely fitted in said circular recess;

supporting the front side of said wafer on an elastic member in the condition where the back side of said wafer is opposed to the adhesive surface of said adhesive tape; and providing an atmospheric-pressure condition in a sealed space formed on the side opposite to a wafer supporting surface of said elastic member, thereby bringing the back side of said wafer into pressure contact with the adhesive surface of said adhesive tape.

2. An adhesive tape attaching method for attaching an adhesive tape to the back side of a wafer, said wafer having a device area where a plurality of devices are formed on the front side of said wafer and a peripheral marginal area surrounding said device area, wherein the back side of said wafer is formed with a circular recess corresponding to said device area and an annular reinforcing portion surrounding said circular recess so as to correspond to said peripheral marginal area, said adhesive tape attaching method comprising the steps of:

separating a sealed space into a first sealed space and a second sealed space by a piston inserted in said sealed space;

fixedly holding said adhesive tape in said second sealed space in the condition where an adhesive surface of said adhesive tape is opposed to said piston;

supporting said wafer to said piston in said second sealed space in the condition where said circular recess formed on the back side of said wafer is opposed to the adhesive surface of said adhesive tape;

fixedly providing a plate member in the condition where said plate member is opposed to a nonadhesive surface of said adhesive tape, said plate member being adapted to engage with said circular recess of said wafer; and providing a low-pressure condition in said second sealed space and an atmospheric-pressure condition in said first sealed space to thereby drive said piston and engage said plate member into said circular recess of said wafer through said adhesive tape, so that the back side of said wafer comes into pressure contact with the adhesive surface of said adhesive tape.

3. The adhesive tape attaching method according to claim 2, wherein the outer circumferential portion of said adhesive tape is supported to an annular frame, and said step of fixedly holding said adhesive tape comprises the step of holding said annular frame.

* * * * *